United States Patent
Heirich et al.

(10) Patent No.: US 7,038,914 B2
(45) Date of Patent: May 2, 2006

(54) PROCESSOR MODULE MOUNTING ASSEMBLY AND A METHOD OF USE

(75) Inventors: Douglas L. Heirich, Palo Alto, CA (US); Steven T. Holmes, Mountain View, CA (US); James Guy Smeenge, Campbell, CA (US); Jason Alan Burton, Sunnyvale, CA (US)

(73) Assignee: Apple Computer, Inc., Cupertino, CA (US)

( * ) Notice: Subject to any disclaimer, the term of this patent is extended or adjusted under 35 U.S.C. 154(b) by 64 days.

(21) Appl. No.: 10/600,127

(22) Filed: Jun. 20, 2003

(65) Prior Publication Data

US 2004/0257769 A1    Dec. 23, 2004

(51) Int. Cl.
*H05K 7/20* (2006.01)

(52) U.S. Cl. .................. 361/719; 361/697

(58) Field of Classification Search ........ 361/697, 361/709, 719, 760, 769; 257/706, 707, 709, 257/712, 718, 719, 726, 727
See application file for complete search history.

(56) References Cited

U.S. PATENT DOCUMENTS

| | | | |
|---|---|---|---|
| 6,331,937 B1 * | 12/2001 | Bartyzel | 361/687 |
| 6,384,331 B1 * | 5/2002 | Ku | 174/52.1 |
| 6,460,170 B1 * | 10/2002 | Shaeffer et al. | 716/15 |
| 6,542,366 B1 * | 4/2003 | Davis et al. | 361/703 |
| 6,549,410 B1 * | 4/2003 | Cohen | 361/704 |
| 2003/0011986 A1 * | 1/2003 | Ariga | 361/687 |
| 2003/0129863 A1 * | 7/2003 | Alcoe et al. | 439/73 |

* cited by examiner

*Primary Examiner*—Anatoly Vortman
*Assistant Examiner*—Corey Broussard
(74) *Attorney, Agent, or Firm*—Sawyer Law Group LLP (57) ABSTRACT

A computer assembly is disclosed. The computer assembly comprises a chassis and a mounting module rigidly coupled to the chassis. The mounting module is for cooling the computer assembly when in operation. The computer assembly includes at least one circuit board suspended from the module. The at least one circuit board has a known orientation relative to the module and the at least one circuit board has a variable orientation relative to the chassis. A system and method in accordance with the present invention provides a stable mounting for the cooling system that includes a large heat sink. The method and system in accordance with the present invention prevents the disturbance of the critical alignment of the printed circuit board with the heatsink from shock and vibration loading. The system and method in accordance with the present invention provides features that ensure full and consistent engagement of the high density signal connectors, while preventing damage to these fragile components in installation and service. Finally, the system and method in accordance with the present invention provides a quick and easy means of assembly of the system, to enable secure reliable interconnection of the printed circuit board with the suspended circuit board (daughter board), while supporting the cooling system heatsink.

21 Claims, 9 Drawing Sheets

PROCESSOR MODULE MOUNTING ASSEMBLY AND A METHOD OF USE

FIELD OF THE INVENTION

The present invention relates generally to a computer system and more particularly to a system for cooling a component in the computer system.

BACKGROUND OF THE INVENTION

Larger power dissipations in the central processing modules (CPU) used in consumer and desktop computer systems are requiring cooling systems of greater capacity than previously used in the industry. These are more massive, and by their greater mass, create new mechanical problems. As microprocessors have become more powerful and more compact, there has been a need to ensure that an efficient cooling system be in place to allow for the proper operation of the computer. Desktop computer systems are utilized in professional environments, educational environments and at home. As is well known these computers can be networked or they can be standalone devices.

Standard practice within the computer industry is to mount heatsink assemblies to the printed circuit board that contains the electronic components to be cooled. With relatively smaller cooling systems, this can be implemented as a simple direct assembly. As microprocessors become smaller and more powerful they generate more heat. For example, microprocessors used in conventional systems dissipate between 20–60 watts of power whereas the more powerful systems will dissipate over 100 watts of power.

With these higher performance systems, the large mass of the cooling system can create excessive stresses on the printed circuit boards when subjected to shock and vibration loads. Furthermore, as the microprocessor becomes smaller the heat flux density is greater, the resistance to conduction is greater, and therefore the size of the heat sink must be greater to ensure that the heat is dissipated. This further exacerbates the loading and vibrational problems when using conventional heat sink assemblies when attempting to keep the computer system cool.

Figure 1:
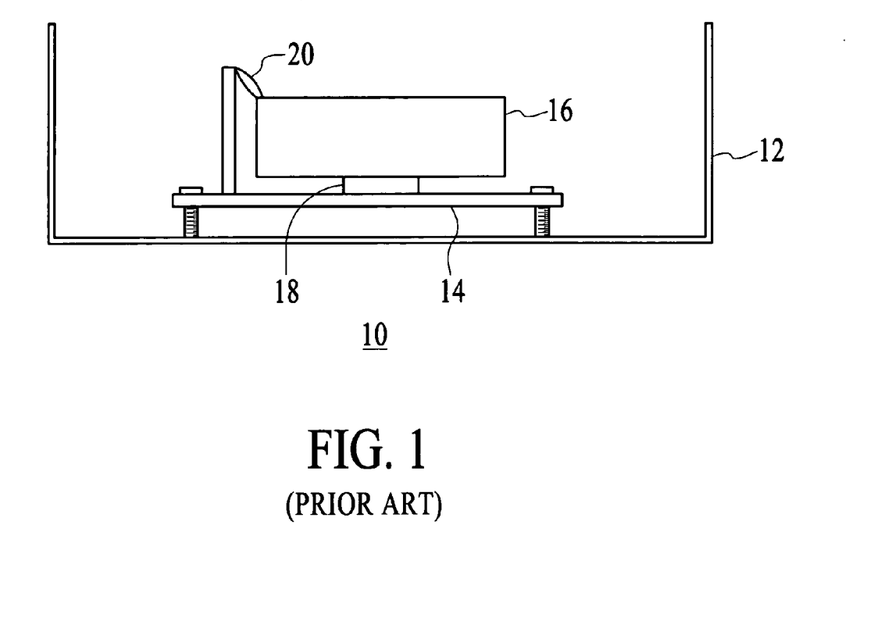
FIG. 1 is a partial cutaway view of the interior of a computer system which includes a conventional system for cooling a microprocessor in a computer system.

A conventional way to provide a cooling system in a computer system is to mount the heatsink via a spring loaded compression system. FIG. 1 is a partial cutaway view of the interior of a computer assembly 10 which includes a conventional system for cooling a microprocessor within the computer assembly. The computer assembly 10 includes a chassis 12. A circuit board 14 is coupled rigidly to the chassis to ensure that it has the proper orientation. A heat sink 16 is coupled to the board via spring 20 in compression to provide cooling to the microprocessor 18 on the circuit board 14. This creates a vulnerability to dislocation of the thermal interface when shocked or vibrated, as the suspended heatsink mass is free to move, influenced only by the compliant springs.

In some conventional computer assemblies, the processor is mounted on a separate dedicated printed circuit board (i.e., a daughter board), rather than following the common industry practice of installing it on the main logic board. The daughter board is fastened to the logic board, allowing the entire cooling system and daughter card to be cantilevered from the logic board. This also makes the computer system more vulnerable to damage by shock and vibration loading when a large heat sink is utilized.

Finally, systems with daughter cards or socketed processors typically use high density signal connectors with very limited engagement range. Such systems are vulnerable to disconnection or improper connection if the positions of the related printed circuit boards vary. The connectors are also highly fragile, and are easily damaged in installation or field repair service.

Accordingly, what is needed is a system and method for overcoming the above-identified problems. The present invention addresses such a need.

SUMMARY OF THE INVENTION

A computer assembly is disclosed. The computer assembly comprises a chassis and a mounting module rigidly coupled to the chassis. The mounting module is for cooling the computer assembly when in operation. The computer assembly includes at least one circuit board suspended from the module. The at least one circuit board has a known orientation relative to the module and the at least one circuit board has a variable orientation relative to the chassis.

A system and method in accordance with the present invention provides a stable mounting for the cooling system that includes a large heat sink. The method and system in accordance with the present invention prevents the disturbance of the critical alignment of the printed circuit board with the heatsink from shock and vibration loading. The system and method in accordance with the present invention provides features that ensure full and consistent engagement of the high density signal connectors, while preventing damage to these fragile components in installation and service. Finally, the system and method in accordance with the present invention provides a quick and easy means of assembly of the system, to enable secure reliable interconnection of the printed circuit board with the suspended circuit board (daughter board), while supporting the cooling system heatsink.

DETAILED DESCRIPTION

The present invention relates generally to a computer system and more particularly to a system for cooling a component in the computer system. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Larger power dissipations in the central processing modules (CPU) used in consumer and desktop computer systems are requiring cooling systems of greater capacity than previously used in the industry. These are more massive, and by their greater mass, create new mechanical problems.

A system and method in accordance with the present invention provides a stable mounting for the cooling system that includes a large heat sink. The method and system in accordance with the present invention prevents the disturbance of the critical alignment of the printed circuit board with the heatsink from shock and vibration loading. The system and method in accordance with the present invention provides features that ensure full and consistent engagement of the high density signal connectors, while preventing damage to these fragile components in installation and service. Finally, the system and method in accordance with the present invention provides a quick and easy means of assembly of the system, to enable secure reliable interconnection of the printed circuit board with the heatsink, while supporting the cooling system heatsink.

The cooling system mounting scheme in accordance with the present invention utilizes a heatsink as a fixed reference point, and at least one printed circuit board floats in space to accommodate it. As before mentioned, in conventional mounting modules for cooling, the printed circuit board is the fixed reference point; i.e., the printed circuit board is fixed to the chassis of the computer system and the heatsink is mounted on top on the printed circuit via a spring-loaded mechanism. The cooling system mounting scheme in accordance with the present invention mounts the heatsink rigidly with the chassis and the printed circuit board is fixed relative to the heatsink. In so doing the vibratory and torsional loads are substantially reduced in relation to conventional cooling systems. It is known that to induce dissipation of power between the heatsink and the microprocessor a thermal interface material or grease is placed there between. Hence, it is very important that surfaces of the heatsink and the microprocessor be tightly coupled together to insure adequate power dissipation. A system and method in accordance with the present invention addresses these issues.

To further describe the features of the present invention refer now to the following description in conjunction with the accompanying figures.

Figure 2:
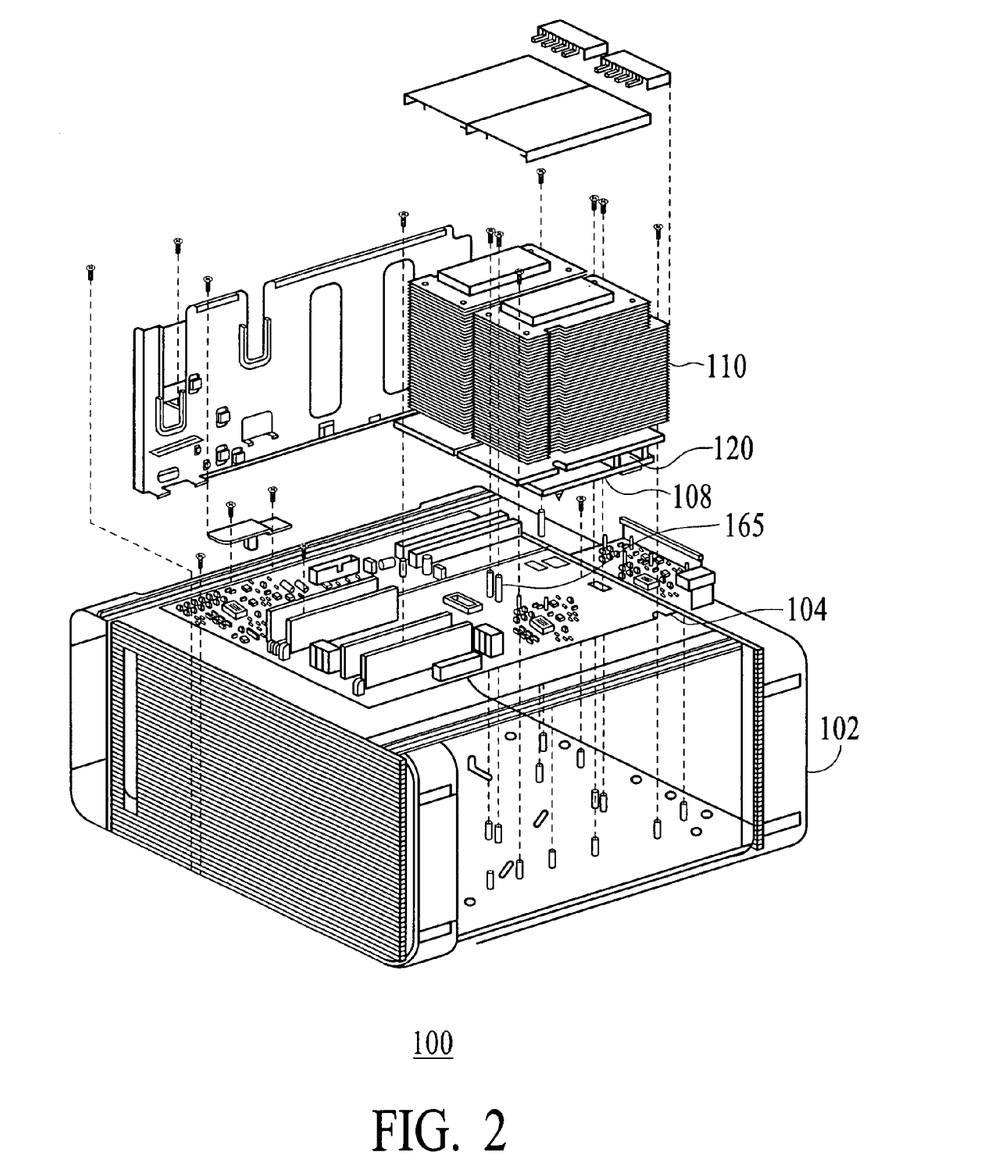
FIG. 2 illustrates an exploded view of a computer assembly in accordance with the present invention.
Figure 3:
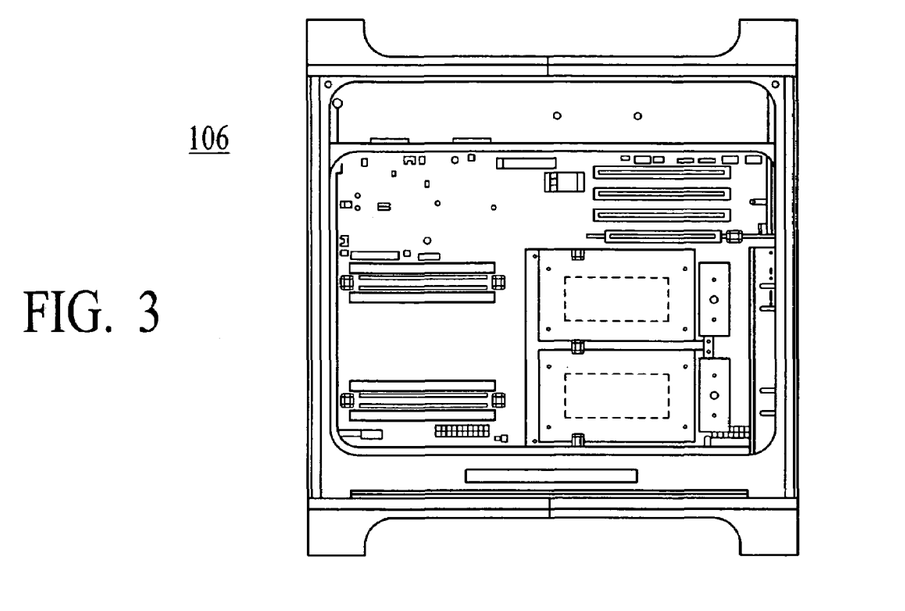
FIG. 3 illustrates a top view of the processor module mounting assembly attached to the chassis and the main logic board in accordance with the present invention.

FIG. 2 illustrates an exploded view of a computer assembly 100 in accordance with the present invention. The computer assembly 100 includes a chassis 102. The chassis 102 is coupled to a printed circuit board 104 and a processor mounting module 106. The processor mounting module 106 includes a central processing unit die (not shown) located generally at point 108. The die is fixed to a heatsink 110. The heatsink 110 is utilized to cool the processor die when in operation. The processor mounting module 106 is rigidly attached to the chassis 102. The printed circuit board 104 is oriented relative to the chassis 102 and is not directly coupled to the chassis 102. FIG. 3 illustrates a top view of the processor mounting module 106 attached to the chassis and the main logic board in accordance with the present invention.

Figure 4A:
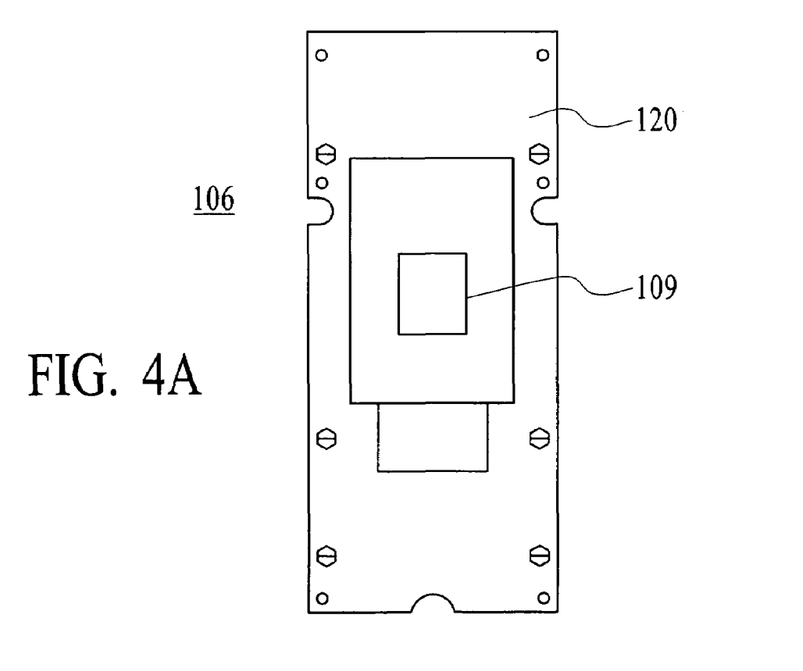
FIG. 4A illustrates a bottom view of the processor module mounting assembly.
Figure 4B:
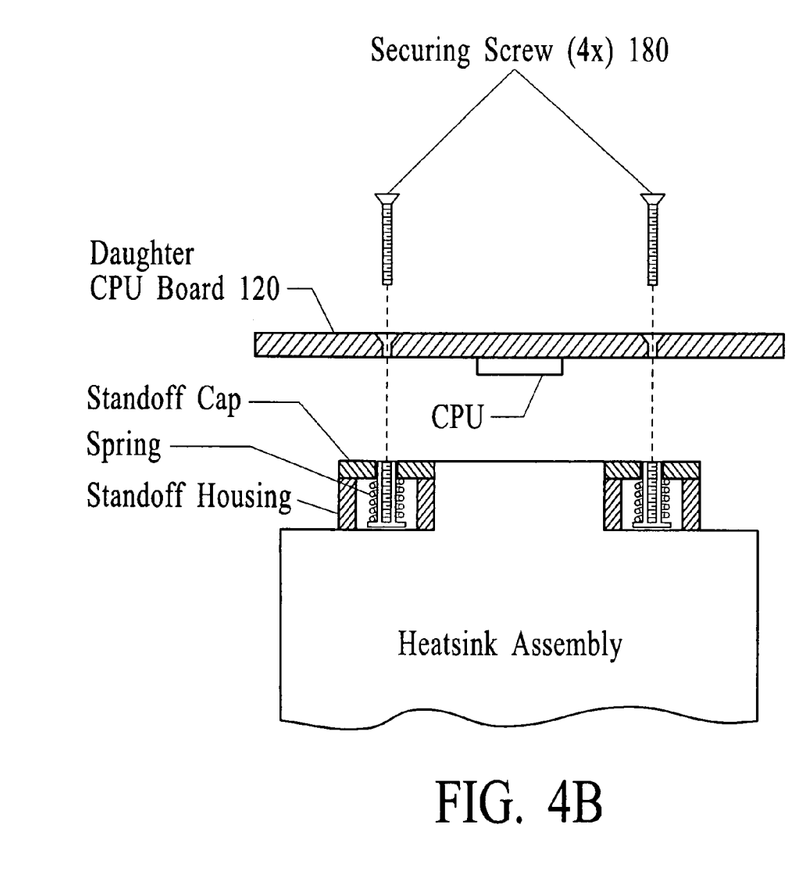
FIG. 4B is an illustration of the spring-loaded mount of the mounting module.
Figure 4C:
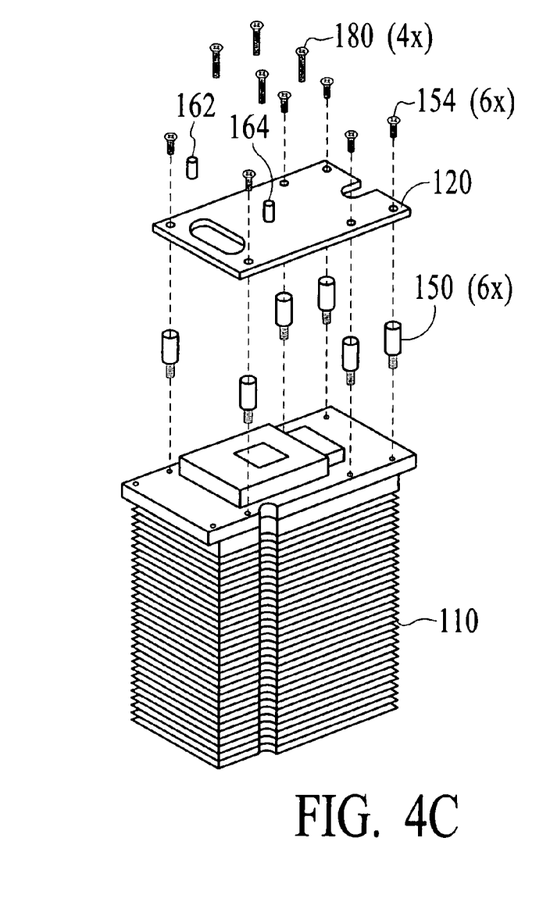
FIG. 4C illustrates an exploded view of the mounting module.

FIG. 4A illustrates a bottom view of the processor module mounting assembly 100. In this embodiment, the processor mounting module 106 includes a daughter card 120 upon which the processor die 109 is mounted. A thermal interface material (TIM) is applied to the microprocessor die 109 for power dissipation. One of ordinary skill in the art recognizes that the processor could be mounted directly on the printed circuit board 104 and the heatsink 110 could be placed directly thereon to provide the same cooling effect. FIG. 4B is an illustration of the spring-loaded mount 121 of the mounting module, including securing screws 180, standoff caps, springs, and standoff housings, as shown. FIG. 4C illustrates an exploded view of the mounting module.

In the preferred embodiment, the daughter card 120 is attached to the heatsink via a spring loaded mount 121, which allows optimal compression of the Thermal Interface Material (TIM) during the assembly process. The daughter card 120 adjusts under the influence of this spring-loaded mount 121 to achieve its optimum spatial orientation related to the heatsink. The daughter card position is then stabilized by self-adjusting standoffs 150 that prevent it from moving out of position under the influence of outside forces, and allow it to work in conjunction with the spring-loaded mount to ensure proper orientation of the printed circuit board and heatsink.

Figure 5A:
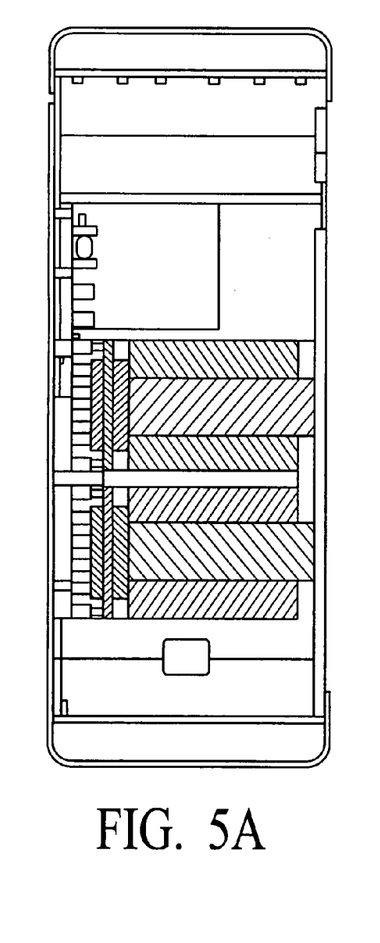
FIG. 5A is a first cross-sectional view of the module coupled to a chassis and the printed circuit board.
Figure 5B:
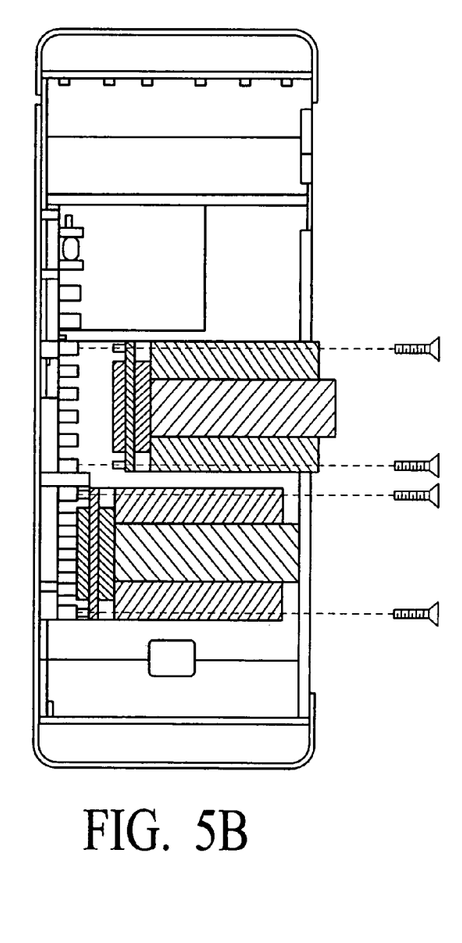
FIG. 5B is an exploded cross-sectional view of the module coupled to the chassis and a printed circuit board, and showing a module approaching the coupled position.
Figure 6A:
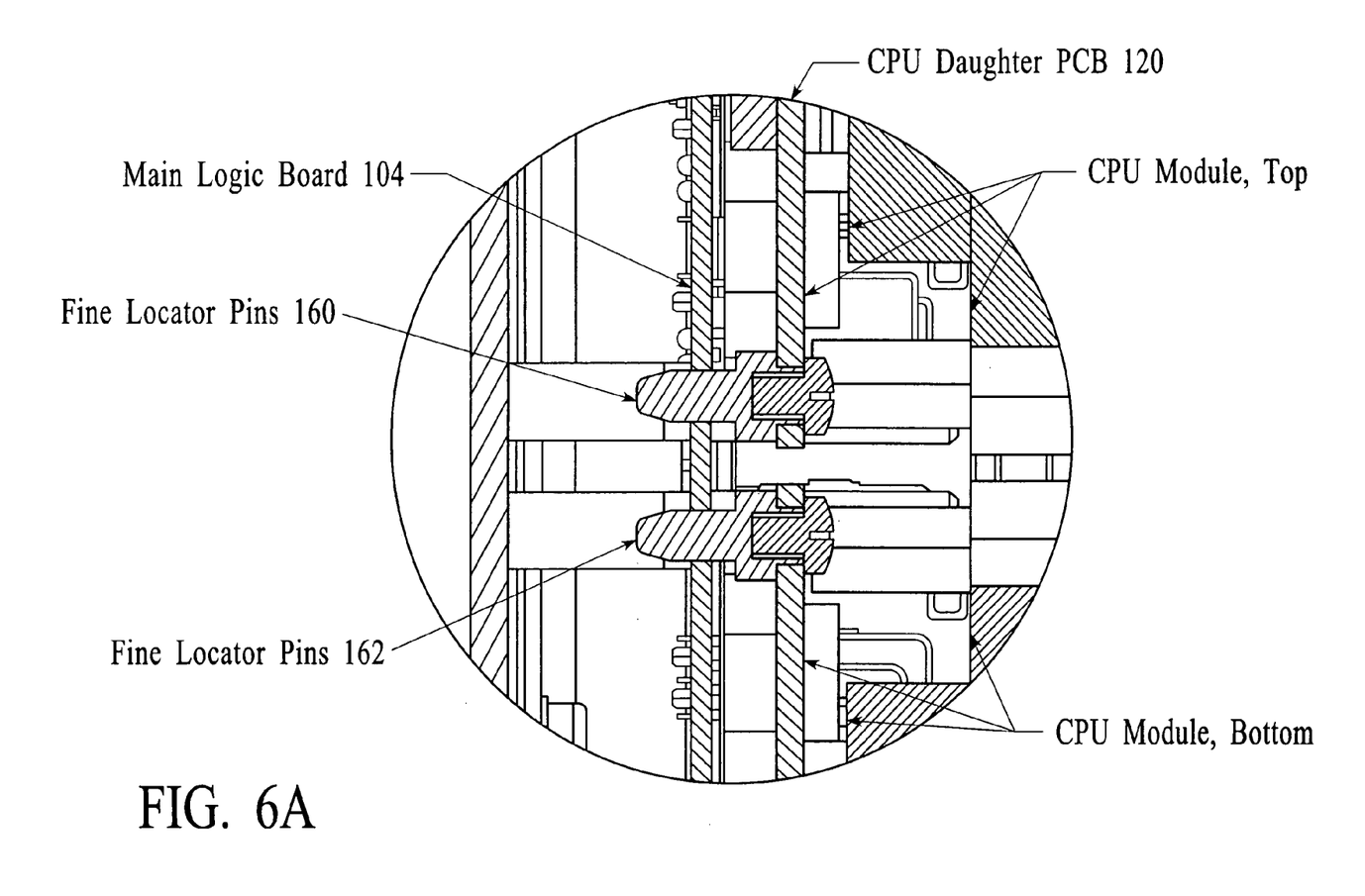
FIGS. 6A and 6B are first and second detail views of FIG. 4.
Figure 6B:
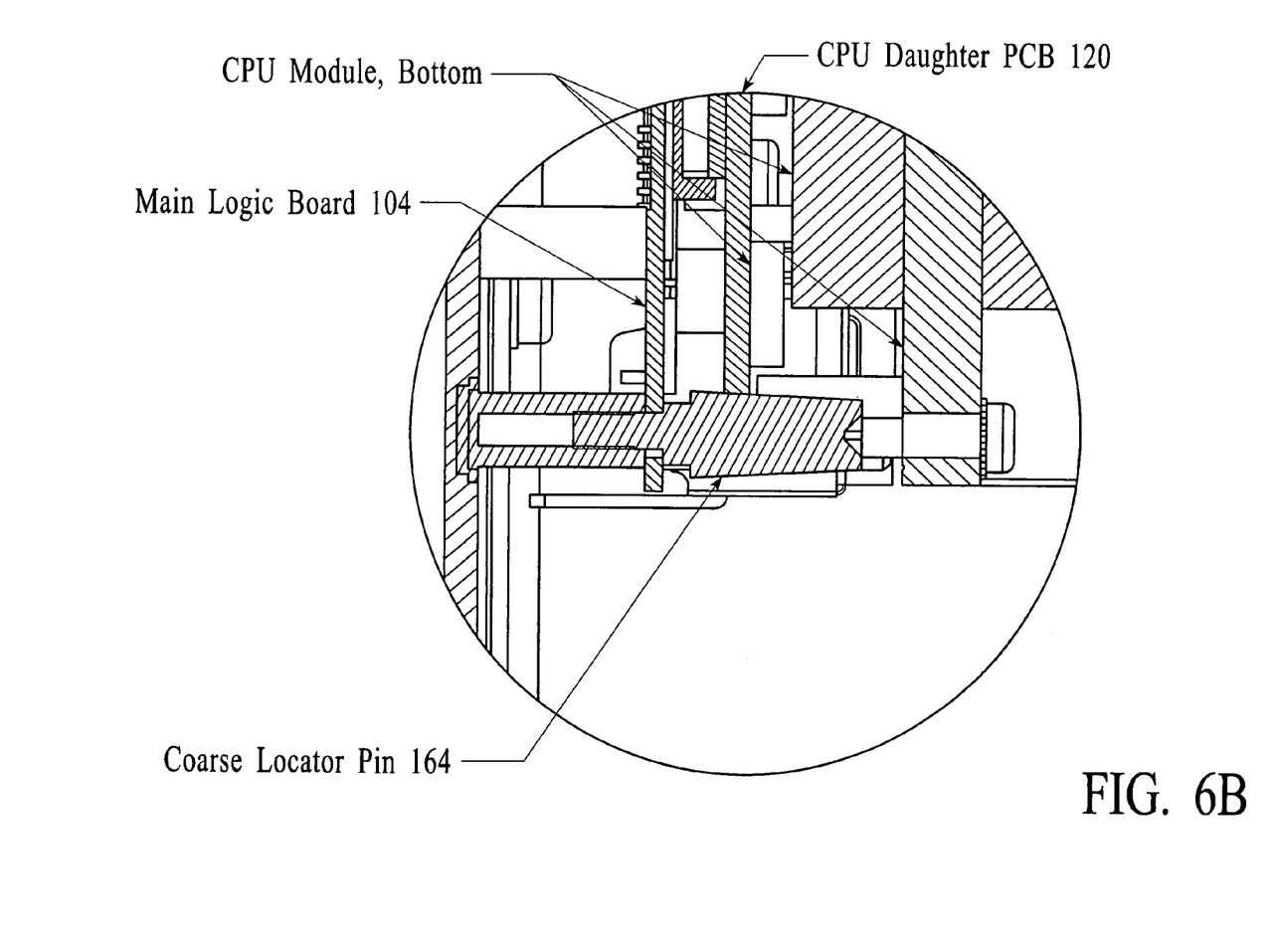
Figure 7:
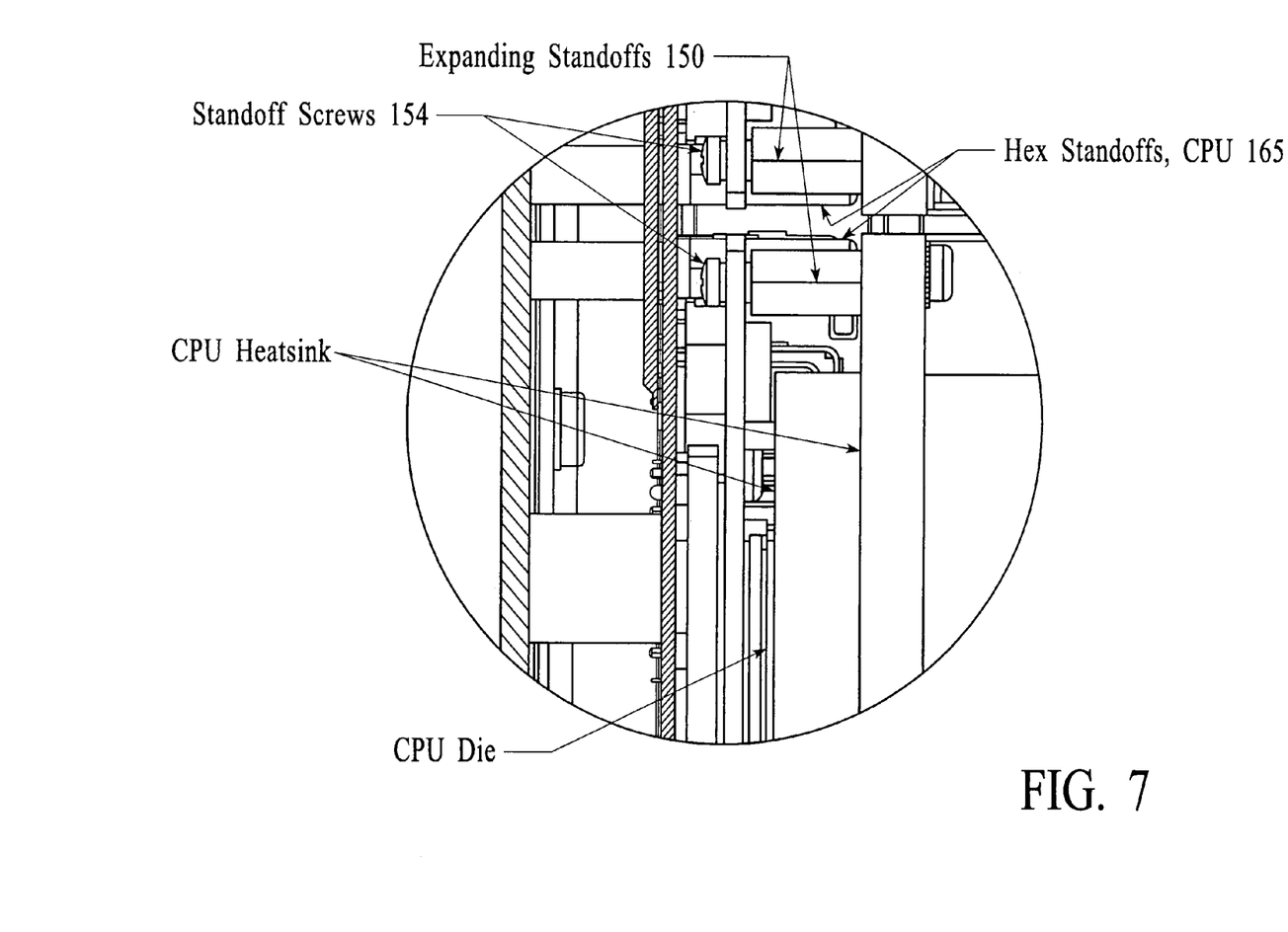
FIG. 7 is a detail view of FIG. 5 which illustrates the standoffs and expanding spacers for securing the circuit board to the heatsink.

FIG. 5A is a first cross-sectional view of the module coupled to the chassis and the printed circuit board. FIG. 5B is an exploded cross-sectional view of the mounting module coupled to the chassis and the printed circuit board. FIGS. 6A and 6B are first and second detail views of FIG. 4. In these detail views, two fine locator pins 160 and 162 and one coarse locator pin 164 and CPU support standoff 165 are utilized to orient the printed circuit board 104 relative to the mounting module 106. FIG. 7 is a detail view of FIG. 5 which illustrates the standoffs for securing the circuit board 104 to the mounting module 106. Referring to these figures together, the printed circuit board 104 is mounted to the chassis 102 via fixed CPU standoffs 165, 166, and fastening features at its periphery, leaving the inner portion of the printed circuit board 104, where the interface connectors reside, free to float relative to the chassis 102 through moderate deflection and bending of the printed circuit board 104. The engagement of the connector, and the resting of the module on its CUP mounting standoffs (165), determines the extent of the deflection.

Figure 8A:
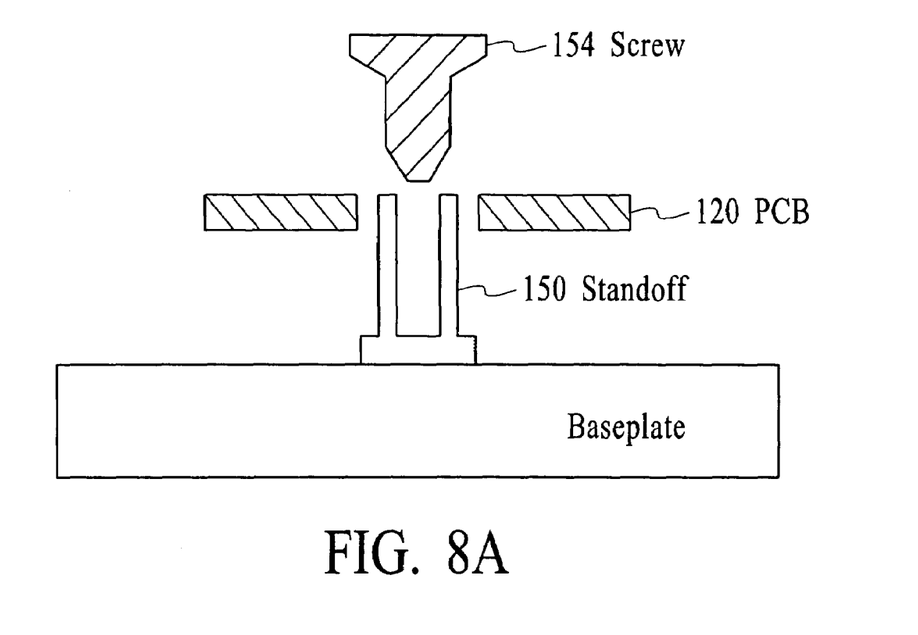
FIGS. 8A and 8B are simplified block diagrams of the standoffs in securing the printed circuit board to the heatsink.
Figure 8B:
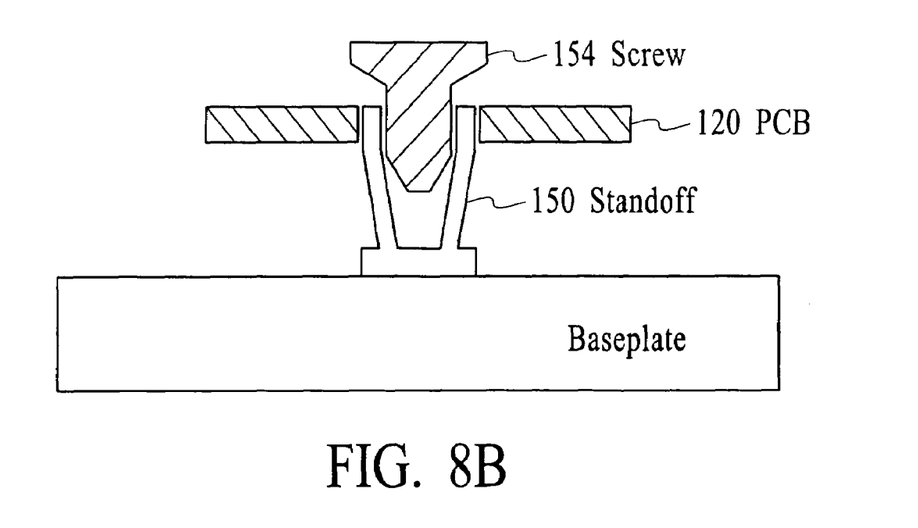

FIGS. 8A and 8B are simplified block diagrams of the standoffs for securing the printed daughter board 120 to the standoffs of the mounting module 106 to the heatsink. As is seen, the standoff 150 protrudes through an aperture 152 in the circuit board 120. When a screw 154 is inserted within a standoff 150, the standoff 150 expands within the aperture 152 to secure the circuit board 120 to the standoff 150. In so doing, the board 120 is oriented to the heatsink and secured, but the equilibrium position of the board relative to the heatsink, which is determined by the spring-loaded mount 121, is not altered.

Tapered pin features, including fine locator pins 160 and 162 and coarse locator pin 164, are provided to locate the processor mounting module relative to the printed circuit board, allowing blind engagement. The guide feature tolerances are determined so as to prevent inadvertent damage of delicate high density signal connectors during blind insertion.

Accordingly, a method and system in accordance with the present invention utilizes features in the chassis to provide a rigid mounting of the heatsink. These features create a reference rest position for the subassembly. The relative position of the printed circuit board mounting features is chosen so that the printed circuit board will deflect to absorb all variance in the position of the processor relative to the heatsink when the subassembly is fully seated. This ensures that the limited travel high density signal connectors will be fully engaged regardless of dimensional or positional variation of either circuit board.

The processor mounting module is installed into the chassis so as to mate in blind fashion with the retained printed circuit board. This provides a quick accurate installation process, even with significant dimensional variation of the component parts. It also provides a stable assembly that survives extreme shock and vibration loading without damage or misoperation.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A computer assembly comprising:
    a chassis;
    a mounting module rigidly coupled to the chassis, the mounting module for cooling the computer assembly; and
    a circuit board suspended from the module, wherein the mounting module is coupled to a processor on the circuit board, and wherein the circuit board is connected to the module at an adjusted equilibrium spatial orientation of the circuit board that accommodates the coupling of the module and the processor, wherein the connection is provided by at least one spring connector and at least one rigid connector, wherein the at least one spring connector allows the adjusting of spatial orientation of the circuit board relative to the module for connection to enable the equilibrium spatial orientation, and wherein the at least one rigid connector adapts to the equilibrium spatial orientation and stabilizes and maintains the equilibrium orientation of the circuit board relative to the module.

2. The computer assembly of claim 1 wherein the mounting module comprises a heatsink.

3. The computer assembly of claim 2 wherein a thermal interface material is provided between the processor and the heatsink.

4. The computer assembly of claim 2 wherein the circuit board is a main logic board of the computer assembly, and wherein the heatsink is located relative to the main logic board via pin features, wherein the pin features include at least one fine locator pin and at least one coarse locator pin.

5. The computer assembly of claim 1 wherein the spring connector includes a spring-loaded mount.

6. The computer assembly of claim 1 wherein the rigid connectors include a portion that is positioned to expand parallel to the surface of the circuit board within an aperture in the circuit board to secure the circuit board to the module without altering the eciuilibrium spatial orientation of the circuit board.

7. The computer assembly of claim 6 wherein the portion of the at least one rigid connector is a standoff, and wherein the rigid connector includes a fastener to be inserted within the standoff through an aperture in the circuit board, wherein a clearance space is provided between the standoff and the aperture that allows the standoff to adjust and expand parallel to the surface of the circuit board within the aperture when the fastener is inserted.

8. The computer assembly of claim 6 wherein the circuit board is a daughter board which is connected with a main logic board of the computer assembly.

9. The computer assembly of claim 6 wherein the circuit board is a main logic board of the computer assembly.

10. A mounting module for a computer assembly comprising:
    a heatsink assembly for cooling the computer assembly, wherein the heatsink assembly is coupled rigidly to a chassis of the computer assembly and is also coupled to a processor on a circuit board within the computer assembly;
    at least one spring connector coupled between the heatsink assembly and the circuit board, the at least one spring connector allowing the circuit board to be connected to the heatsink assembly at an adjusted equilibrium spatial orientation of the circuit board that accommodates the coupling of the heatsink assembly and the processor; and
    at least one rigid connector coupled between the heatsink assembly and the circuit board, the at least one rigid connector adapting to the equilibrium spatial orientation and stabilizing and maintaining the equilibrium orientation of the circuit board relative to the module.

11. The mounting module of claim 10 wherein the heatsink assembly comprises a heatsink, and wherein the equilibrium position of the circuit board allows a tight coupling between the heatsink and the processor to insure adequate power dissipation from the processor.

12. The mounting module of claim 11 wherein a thermal interface material is provided between the processor and the heatsink assembly.

13. The mounting module of claim 10 wherein the spring connector includes a spring-loaded mount.

14. The mounting module of claim 10 wherein the rigid connectors include a portion that is positioned to expand parallel to the surface of the circuit board within an aperture in the circuit board to secure the circuit board to the module without altering the equilibrium spatial orientation of the circuit board.

15. The mounting module of claim 14 the portion of the at least one rigid connector is a standoff, and wherein the rigid connector includes a fastener to be inserted within the standoff through an aperture in the circuit board, wherein a clearance space is provided between the standoff and the aperture that allows the standoff to adjust and expand parallel to the surface of the circuit board within the aperture when the fastener is inserted.

16. The computer assembly of claim 10 wherein the circuit board is a daughter board which is connected with a main logic board of the computer assembly.

17. The computer assembly of claim 10 wherein the circuit board is a main logic board of the computer assembly.

18. The computer assembly of claim 10 wherein the at least one spring connector is separate from the at least one rigid connector.

19. A method for securing a mounting module in a computer assembly comprising:

attaching a circuit board to a heatsink assembly for cooling the computer assembly, such that the heatsink assembly is coupled rigidly to a chassis of the computer assembly and is coupled to a processor on the circuit board within the computer assembly, wherein the circuit board is attached to the heatsink assembly by adjusting the spatial orientation of the circuit board to an equilibrium position that accommodates the coupling of the heatsink assembly and the processor, wherein the adjustment of the spatial orientation of the circuit board is allowed by at least one spring connector coupled between the heatsink assembly and the circuit board; and stabilizing and maintaining the equilibrium position of the circuit board by coupling at least one rigid connector between the heatsink assembly and the circuit board, the rigid connector adapting to the equilibrium position allowed by the at least one spring connector.

20. The method of claim 19 wherein the at least one rigid connector includes a standoff positioned to expand parallel to the surface of the circuit board within an aperture in the circuit board when a fastener is inserted in the standoff to secure the circuit board to the heatsink assembly by self-adjusting without altering the equilibrium spatial orientation of the circuit board.

21. The method of claim 19 wherein the circuit board is a daughter board, and wherein the daughter board and the heatsink assembly comprise the mounting module, and further comprising performing blind engagement of the mounting module with a main logic board of the computer assembly, the blind engagement assisted by tapered pin features, the pin features including at least one fine locator pin and at least one coarse locator pin.

* * * * *